United States Patent [19]

Fujita

[11] 4,330,867
[45] May 18, 1982

[54] CHANNEL SELECTION DATA MEMORY DEVICE

[75] Inventor: Masahiro Fujita, Kumagaya, Japan
[73] Assignee: Tokyo Shibaura Denki Kabushiki Kaisha, Kawasaki, Japan
[21] Appl. No.: 137,967
[22] Filed: Apr. 7, 1980
[30] Foreign Application Priority Data
Apr. 10, 1979 [JP] Japan .................. 54-43362
[51] Int. Cl.³ .............................................. H04B 1/26
[52] U.S. Cl. ................................................. 455/186
[58] Field of Search ................. 358/191.1; 455/185, 455/186

[56] References Cited
U.S. PATENT DOCUMENTS
3,968,440 7/1976 Ehni ...................................... 455/186
3,990,027 11/1976 Kawashima ........................... 455/186
4,130,804 12/1978 Mogi et al. ............................ 455/186

Primary Examiner—Marc E. Bookbinder
Attorney, Agent, or Firm—Cushman, Darby & Cushman

[57] ABSTRACT

A channel selection data memory device includes a memory which allows pulse duty data for channel selection corresponding to channels to be read from and written into the memory, a position designating device for designating a given address in the memory which produces an address signal and a write signal when it is operated, a mode selection device for selecting a write mode or a read mode, a tuning pulse generating device which produces a pulse with a duty corresponding to the channel selection pulse duty data read out from the memory in the read mode and sets channel selection pulse duty data with a pulse duty corresponding to the channel to be stored in the write mode, and a write signal supply circuit for supplying the write signal generated by the position designating device when it is operated to the memory.

6 Claims, 6 Drawing Figures

CHANNEL SELECTION DATA MEMORY DEVICE

The present invention relates to an electronic channel selection apparatus assembled into a color television receiver and, more particularly, to a channel selection data memory device.

For selecting a desired channel in a television set, the frequency of a local oscillator in a tuner must be set to the value corresponding to the selected channel. To this end, a television set of the digit channel selection type has a tuning pulse signal generating device assembled thereinto. The tuning pulse signal generating device reads out the pulse duty data corresponding to the desired channel from a memory previously storing pulse duty data, or channel selection data, corresponding to the channels used, and produces a pulse signal on the basis of the data read out. In this case, an operator activates a position switch corresponding to the desired channel, or a key button in a position designation device. Upon the key activation, an address in the memory corresponding to the position switch operated is designated and the pulse duty data is read out from the memory location addressed. The tuning pulse signal generating device produces a pulse signal with the duty corresponding to the pulse duty data read out. The pulse signal produced is applied to a digital to analog converter where it is converted into an analog signal which in turn is applied to a local oscillator. The local oscillator, responding to the analog signal, oscillates to produce a signal with a frequency corresponding to the voltage of the analog signal thereby to select a desired channel.

An example of the conventional channel selection apparatus is shown in FIG. 1. In the apparatus, for reading out the channel section data, a mode selection switch 10 is first turned to a contact A and then a desired position switch of those (not shown) in a position designation device 12 is operated. Through the operation, the duty data is read out from the memory location at the address corresponding to the operated position switch. The duty data is applied to a tuning pulse generator 16 which in turn produces a pulse with the duty corresponding to the duty data read out. The tuning pulse is applied to a D-A converter 18 where it is converted into an analog signal. The analog signal is applied as a tuning signal to a tuner circuit 19, precisely a local oscillator (not shown) of the tuner circuit 19 thereby to select a desired channel.

For writing the data, the mode selection switch 10 is turned to a contact B and a desired position switch of the position designating device 12 is operated to decide an address to be specified in the memory. Then, a sweep switch 20 is turned on to supply a sweep signal through a gate circuit 22 to the tuning pulse generator 16. At this time, if the tuner circuit 19 has an intermediate frequency signal, a voltage signal supplied through an AND gate 28, which ANDs an automatic fine tuning signal from an automatic fine tuning circuit (AFT) 24 and a synchronizing signal from a synchronizing pulse generator (SYNC) 26, is supplied as a sweep stop signal to a sweep stop signal input terminal $T_{ss}$, thereby to stop the sweeping operation. At this time, if the channel received is the desired one, a memory switch 30 is operated to input the data corresponding to the pulse duty at this time from a tuning pulse generator 16 to a memory location with the given address in the memory 14. If the channel received is not the desired one, the sweep switch 20 is operated again without turning on the memory switch 30, whereby the duty of the pulse from the tuning pulse generator 16 is further changed progressively. Subsequently, the channel as described above is received and if the channel is the desired one, the memory switch 30 is turned on to write the data corresponding to the duty of the pulse at that time into the memory 14. The data write mode is performed in this way. Incidentally, IF and FBT in the figure are an intermediate frequency amplifier and a flyback transformer, respectively.

The operation steps by an operator for performing the data write mode of the conventional apparatus are troublesome and complicated as follows:

(1) turn the mode selection switch 10 to the write mode contact B
(2) operate the position switch of the position designating device 12
(3) operate the sweep switch 20
(4) check if the channel received is the desired one or not
(5) When the desired one is received, turn on the memory switch 30 and write the pulse duty data at this time into the corresponding address of the memory 14
(6) turn the mode selection switch to the read mode contact A.

Such complicated operation steps frequently cause problems, for example, the operator fails to write data into the memory.

Accordingly, an object of the invention is to provide a channel selection data memory device with a simplified procedure for data writing which eliminates the possibility of failing to enter data in a memory.

The present invention, which can achieve the above object, may be summarized as a channel selection data memory device involving a memory which allows pulse duty data for channel selection corresponding to channels to be read into and written from said memory, a position designating means for designating a given address in the memory which produces an address signal and a write signal when it is operated, a mode selection means for selecting a write mode or a read mode, a tuning pulse generating means which produces a pulse with a duty corresponding to the channel selection pulse duty data read out from the memory in the read mode and sets channel selection pulse duty data with a pulse duty corresponding to the channel to be stored in the write mode, and first write signal supply means for supplying the write signal generated by the position designating means when it is operated to the memory.

Other objects and features of the invention will be apparent from the following description in connection with the accompanying drawings, in which.

Figure 1:
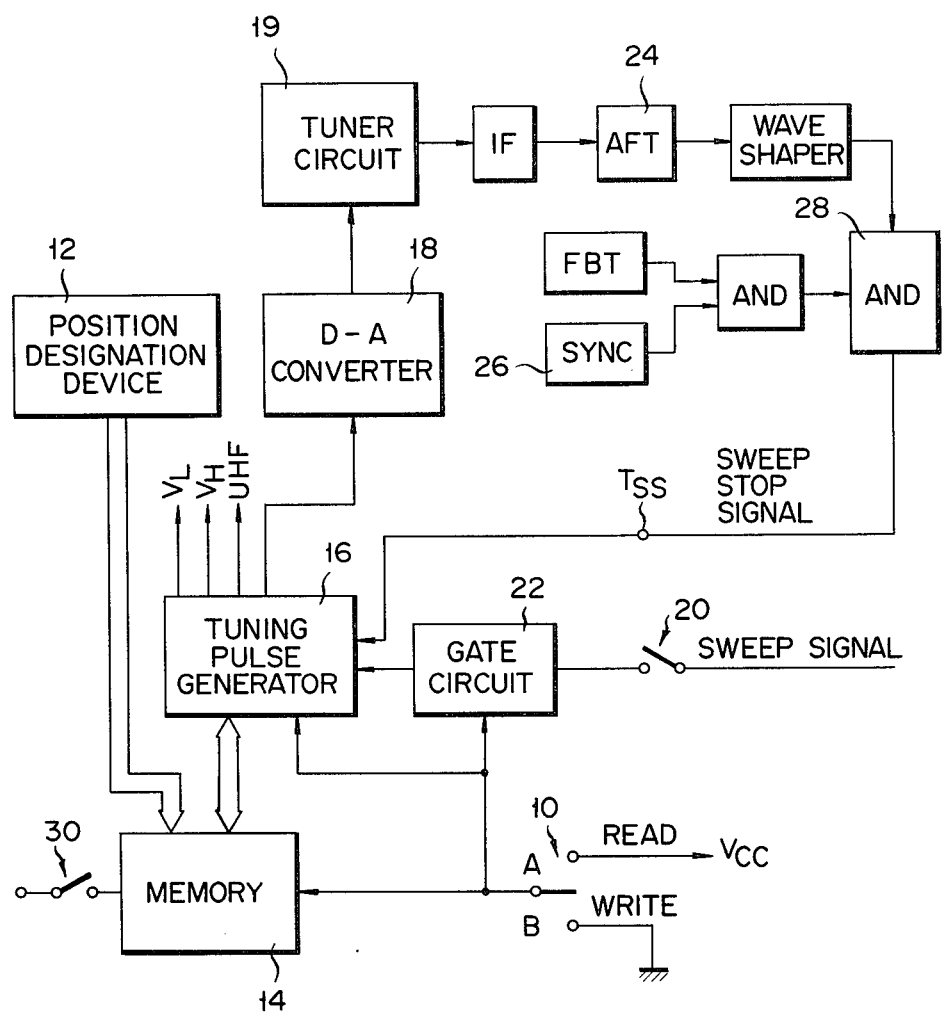
FIG. 1 is a block diagram of a conventional channel selection data memory apparatus in a television receiver.
Figure 2:
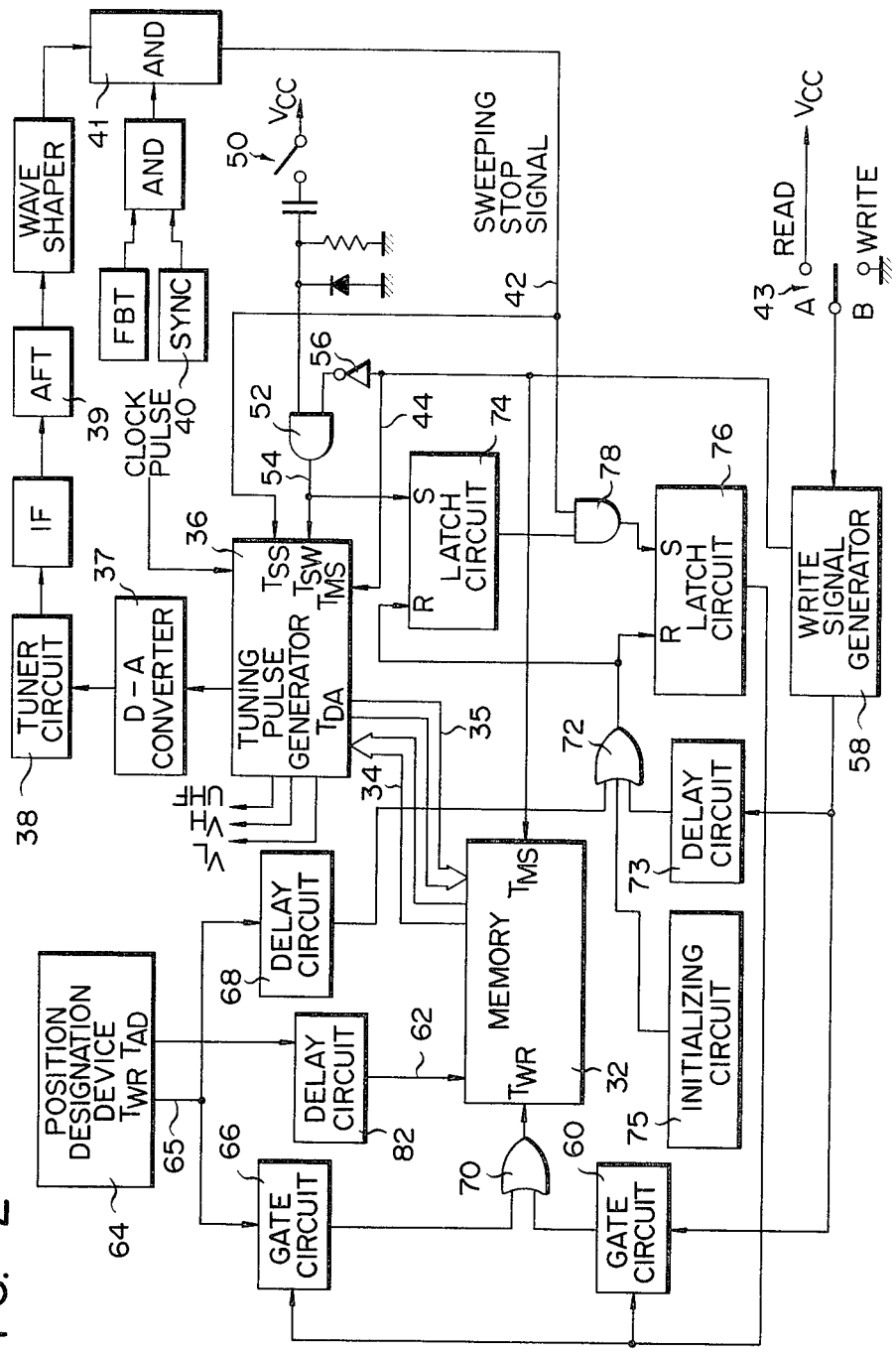
FIG. 2 is a block diagram of a channel selection data memory apparatus according to the invention.

Referring to FIG. 2, there is shown an embodiment of the channel selection data memory device according to the invention. In the figure, a memory 32 is for storing band data and pulse duty data with duties corresponding to respective channels. The data read bus line 34 from memory 32 and the data write bus line 35 to memory 32 are connected to a data input/output terminal $T_{DA}$ of a tuning pulse generator 36. The tuning pulse output terminal of the generator 36 is connected to a digital to analog (D-A) converter 37 which is connected at the output terminal to a tuner circuit 38.

A first control signal input terminal $T_{SS}$ of the generator 36 is coupled with a sweeping stop signal line 42. When an intermediate frequency signal is detected, an automatic fine tuning circuit 39 (AFT) produces an AFT voltage signal. The AFT signal and a synchronizing signal are applied to an AND gate 41 which in turn produces a signal as a sweeping stop signal and transmits it through the line 42 to the input terminal $T_{SS}$ of the generator 36. When receiving the stop signal, the generator 36 has a pulse with duty fixed to a value as determined at that time. A second control signal input terminal $T_{MS}$ of the generator 36 is connected to a mode selection signal line 44 connecting to the output contact, or the switching contact, of the mode selection switch 43. The terminal $T_{DA}$ of the generator 36 is switched to the input mode or the output mode in accordance with the contents of the mode selection signal supplied through the line 44. One input contact A of the selection switch 43 is for setting a read mode and is connected to a power source (not shown) at a potential $V_{cc}$. The input contact B of the selection switch 43 is for setting the write mode and connected to a reference potential. A third control signal input terminal $T_{SW}$ of the generator 36 is coupled with sweeping signal line 54 through which a sweeping signal is transmitted from a sweep generator 50 through one of the input terminals of an AND gate 52. Upon receipt of the sweep signal, the tuning pulse generator changes the duty of the tuning pulse signal produced therefrom. Three band lines $V_L$, $V_H$ and UHF taken out from the generator 36 are for switching three frequencies $V_L$, $V_H$ and UHF. The AND gate 52 is connected at the other input terminal to the output terminal of an inverter 56 which is connected at the input terminal to the switching contact of the mode selection switch 43.

The output contact of the mode selection switch 43 is also connected to the mode selection terminal $T_{MS}$ of the memory 32 and the input terminal of the write signal generator 58. The output terminal of the generator 58 is connected to the input terminal of a gate circuit 60.

The memory 32 is also connected to an address signal output terminal $T_{AD}$ of a position designating device 64, through a delay circuit 82.

The write command signal output terminal $T_{WR}$ of the position designation device 64 is connected to a gate circuit 66, through a write signal line 65. The output terminal $T_{WR}$ is connected to the input terminal of the delay circuit 68. The output terminals of gate circuits 60 and 66 are connected to the input terminals of an OR gate 70 which is connected at the output terminal to a control terminal $T_{WR}$ of the memory 32. The output terminal of the delay circuit 68 is connected to a first input terminal of an OR gate 72 which is connected at the second input terminal to the output terminal of a write signal generator 58 through a delay circuit 73. To a third input terminal of the OR gate 72 is connected an initializing circuit 75. The output terminal of the OR gate 72 is connected to the reset terminals "R" of the latch circuits 74 and 76. The initializing circuit 75 produces a pulse when ON to reset the latch circuits 74 and 76. The set terminal "S" of the latch circuit 74 is connected to the output terminal of an AND gate 52 and the output terminal of the latch circuit 74 is connected to one of the input terminals of an AND gate 78. The other input terminal of the AND gate 78 is connected to the sweeping stop signal line 42. The output terminal of the AND gate 78 is connected to a set terminal "S" of the latch circuit 76. The output terminal of the latch circuit 76 is connected to the control terminals of the gate circuits 60 and 66. In the figure, IF and FBT are an intermediate frequency amplifier and a flyback transformer, respectively.

The operation of the channel selection data memory device thus constructed will be described. In the read mode, the switching contact of the mode selection switch 43 is first connected to the fixed contact A thereof. In this case, a signal of logical "1" appears at the output side of the switch 43. The output signal is supplied to the tuning pulse generator 36 via the mode selection signal line 44 so that the generator 36 is set to the read mode. The logical "1" signal is also applied to the mode selection terminal $T_{MS}$ of the memory 32, thereby to set the memory 32 to the read mode. Then, a desired position switch (not shown) of those in the position designating device 64 is selected and activated. As a result, the position designating device 64 supplies an address signal for designating a given address in the memory 32 through an address line 62 to the memory 32. The channel selection data stored in the memory location of the address, that is, the pulse duty data and band data, are produced from the memory 32 and inputted through the bus line 34 to the timing pulse generator 36. In accordance with the duty data, the generator 36 produces a pulse with a duty corresponding to the duty data and a band output signal. The tuning pulse is applied to the D-A converter 37 where it is converted into an analog voltage signal which in turn is applied to the tuner circuit 38. In the tuner circuit 38, the frequency of the signal from the local oscillator is changed in accordance with the tuning analog signal, and a desired channel selection frequency is set. Therefore, if the pulse duty data with the duty corresponding to the channel selection frequency is stored in the memory 32, a desired channel may be received by selecting a corresponding position switch in the position designating device 64.

Consider now the write mode for writing the pulse duty data into the memory 32. In this mode, the switching contact of the mode selection switch 43 is first turned to the contact B. Upon the turning switch 43, the output signal of the switch 43 is logical "0". For this, the output signal of the inverter 56 is logical "1". The write signal generator 58 produces a signal of logical "1" when the mode selection switch 43 is turned from the contact B to the contact A. Accordingly, in a condition that the switch 43 is in the contact B side, the output signal thereof is logical "0". When the sweep switch 50 is closed, a sweep signal of logical "1" is applied through the switch 50 to the AND gate 52, and it, together with the logical "1" signal from the inverter 56, enables the gate 52. Accordingly, the sweep signal is transferred through the sweep signal line 54 connecting to the AND gate 52 to the terminal $T_{SW}$ of the generator 36. The sweep signal is produced when the sweep switch 50 is closed and, by the sweep signal, the generator 36 sequentially fetches the clock signals to successively change the duty of the tuning pulse. The tuning pulse from the generator 36 is applied to the D-A converter 37 which in turn converts it into an analog tuning voltage signal. The tuning signal is applied to the tuner 38 to sweep the frequency in the tuner circuit 38. When an intermediate frequency signal is obtained in the sweeping operation, that is, a channel is selected, the AFT 39 produces an AFT voltage signal which in turn, together with the synchronizing signal from the synchronizing signal generator 40, fully conditions the AND gate 41, so that the output signal from the AND gate 41 is applied as a sweeping stop signal to the terminal $T_{ss}$ of the generator 36, through the sweep stop signal line 42. As a result, the duty of the tuning pulse from the generator 36 is fixed to a value given at that time. At this time, the channel selection data is also fixed corresponding to the pulse duty at that time. If the channel received is the desired one, the operator operates a desired position key of the position designating device 64 to store the channel selection data of the desired channel in the memory location designated in the memory 32. Let us consider the storing of the data. Since the mode selection switch 43 is set to the write mode contact B, as described above, the memory 32 is set to the write mode. Here, if a desired key of the position designation device 64 is operated, the device 64 produces at the terminal $T_{AD}$ an address signal representing a memory address corresponding to the key operated, which in turn is applied through the delay circuit 82 to the memory 32. The write signal is also produced from the terminal $T_{WR}$ at this time. The address signal is applied through the delay circuit 82 and through the address line 62 to the memory 32. The delay time of the delay circuit 82 is so set that it reaches there later than the output signal from the OR gate 70. In this way, a desired address is designated. The write signal is also inputted to the delay circuit 68 and is inputted to the terminal $T_{WR}$ of the memory 32, through the gate circuit 66 and the OR gate 70 after passing through the write signal line 65. As will be detailed subsequently, the gate circuits 60 and 66 have received a logical "1" signal from the latch circuit 76, thus being enabled. As a result of applying the write signal to the terminal $T_{WR}$ of the memory 32, the desired channel selection data set in the generator 36 may be stored in the address designated of the memory 32, after passed through the data write bus line 35.

As the input path of the write signal routed to the memory 32, there is a path routing from the write signal generator 58 to the memory 32 through the gate circuit 60 and the OR gate 70, in addition to a path routing from the position designating device 64 to the memory 32 through the gate circuit 66 and the OR gate 70. Accordingly, the write signal may be inputted into the memory 32 from either path the position designating device 64 or the write signal generator 58. The gate controls of the gate circuits 60 and 66 will be given. The gate circuits 60 and 66 are so controlled as to be enabled at the time of the sweeping stop, in order that an erroneous memory operation is prevented in the read operation and the sweep operation. The gate circuits 60 and 66 are controlled by the output signal from the latch circuit 76, and is enabled only when the data is written into the memory 32 while it is disabled in the read operation. In the write mode, the sweep signal has been applied to the generator 36 through the AND gate 52 when the device is in the sweeping operation. For this, the latch circuit 74 is in "set" state, so that the logical level of the output signal from the latch circuit 74 is "1". The logical "1" level is applied to one of the input terminals of the AND gate 78. At this time, however, the sweep stop signal is absent at the other input terminal of the AND gate 78. Accordingly, a logical "0" is applied thereto. For this, the output signal from the AND gate 78 is logical "0", so that the latch circuit 76 keeps the "reset" state, and its output is logical "0". In other words, the output signal from the latch circuit 76 is logical "0" and therefore the gate circuits 60 and 66 are kept in a "disabled" condition.

To the other input terminal of the AND gate 78 is inputted a sweeping stop signal. Accordingly, a signal of logical "1" is applied to the two input terminals of the AND gate 78. The output signal thereof is accordingly logical "1". For this, the latch circuit 76 is set to produce a logical "1" signal. The gate circuits 60 and 66, receiving the logical "1", are set to the "enabled" condition. In this way, the gate circuits 60 and 66 are controlled to prevent erroneous data storage.

Since the gate circuits 60 and 66 have been enabled, those are so controlled as to be disabled again after the storing operation is completed. More specifically, the write signal is inputted from the position designation device 64 to the delay circuit 68. The write signal from the write signal generator 58 is inputted into the delay circuit 73 and is delayed by a given time and then is inputted into the "reset" terminal "R" of each of the latch circuits 74 and 76, through the OR gate 72. Accordingly, the output signal from the latch circuit 74 is logical "0" to disable the gate 78, so that the output signal from the latch circuit 76 is logical "0", and the gates of the gate circuits 60 and 66 are disabled again. The delay time of the delay circuit 73 or 68 may be the same or different.

In the above description, the write operation corresponding to the first key button is performed by depressing the next desired key button after the desired position button is depressed to obtain the desired channel. For storing only a single position, the means for supplying the write signal to the memory uses the output write signal produced from the write signal generator 58 when the mode selection switch 43 is turned to the read mode contact A.

The channel selection data memory device according to the invention, which has been described referring to FIG. 2, is so designed that the write signal may be inputted into the memory 32 through the routes. More specifically, in the write mode, by operating the key button of the position designation device 64, and at the end of the write mode, by turning the mode selection switch 43 to the read mode contact A, the write pulse is produced from the generator 58 and is applied to the memory 32. Therefore, the storage of the channel selection data is reliably stored into the memory 32. Further, when a desired channel is obtained, the key button of the position designation device is operated, the write signal and the address signal are simultaneously produced. As a result, data is positively stored in the memory 32 and the complicated switching operation of the conventional device is eliminated, thereby alleviating the operation load of the operator.

The gates 60 and 66 are so controlled that those are enabled only when the sweeping stop signal is present to permit the write signal to pass therethrough to the memory 32. Such a control of those gates prevents the operator to erroneously store the data into the memory.

Further, the write signal may be obtained by turning the mode selection switch 43 to the read mode contact A, as described above. For writing the channel selection data of only one channel, in the case of the operation manner in which a desired key button is previously operated before a desired channel is received, there is no need to operate the next key button and the channel selection data may be written into the memory merely by turning the mode selection switch 43 to the read mode contact A.

As described above, the channel selection data memory device according to the invention may prevent the operator from failing to store the channel selection data into the memory and may simplify the storing operation of the data into the memory.

Figure 3:
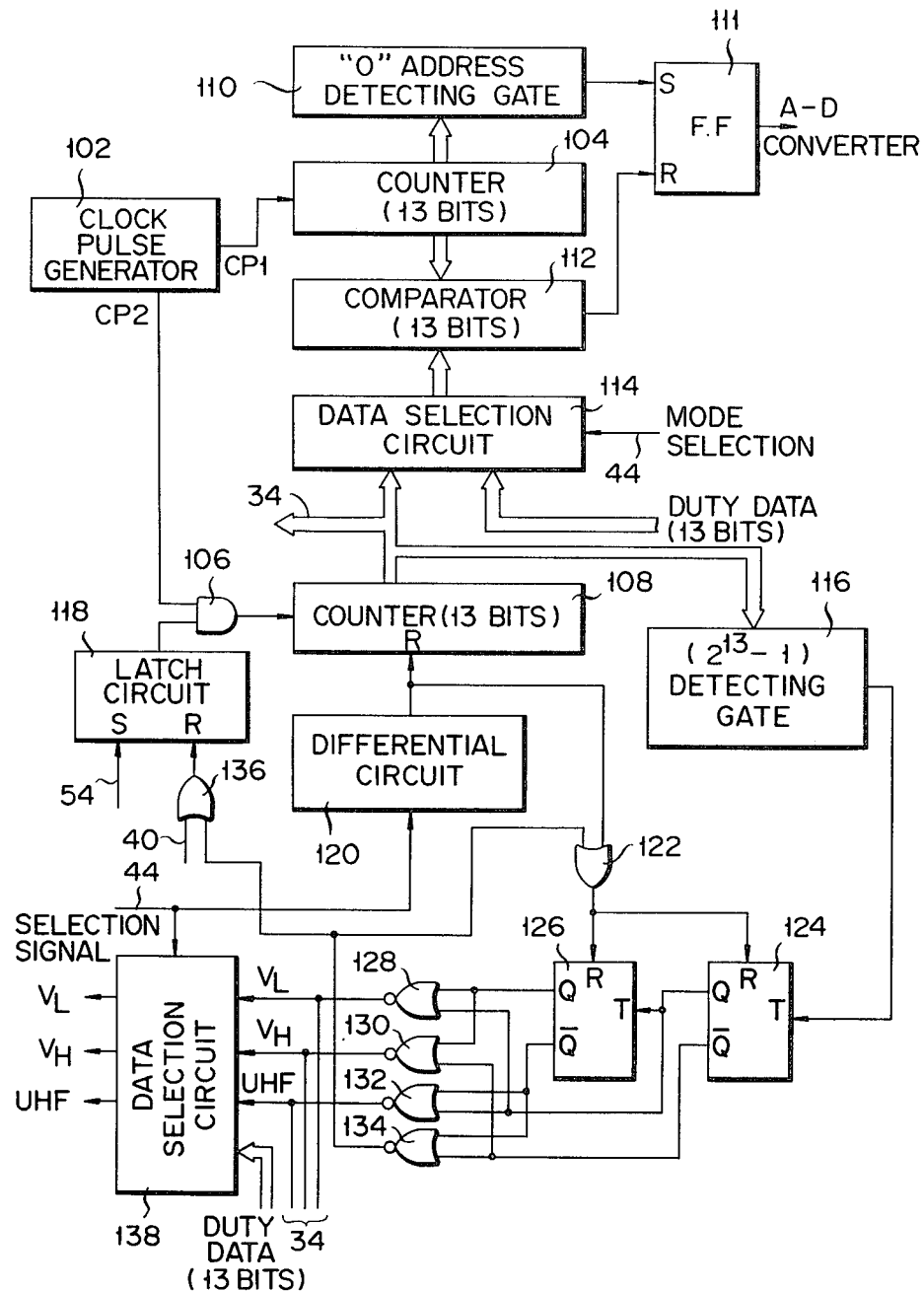
FIG. 3 is a detailed circuit of a tuning pulse generator used in the apparatus in FIG. 2.

FIG. 3 is a block diagram of a detail of the tuning pulse generator in the channel selection data memory device shown in FIG. 2. A clock pulse generator 102 produces two kinds of clock pulses CP1 and CP2. The pulse CP1 is counted by a counter 104 of 13 bits while the pulse CP2 is applied through an AND gate 106 to a counter 108 where it is counted. The count data of the counter 104 is further inputted into a "0" address detecting gate 110 and to a 13-bit comparator 112. The output signal from a detecting gate 110 is inputted into the set terminal S of a latch circuit 111 of which the output signal serves as a tuning signal. The count data in the counter 108 is inputted into a data selection circuit 114. The duty data from the memory 32 is also applied to the selection circuit 114. The count data and the pulse duty data are switched and outputted by the mode selection signal inputted to the selection circuit 114. The data selected by the selection circuit 114 is applied to the comparator 112. The comparator 112 compares the count data from the counter 104 with the data from the selection circuit 114. When those are coincident with each other, the comparator 112 produces an output signal which in turn is applied to the reset terminal "R" of the latch circuit 111 to reset the latch circuit 111. In this case, the output signal from the latch circuit 111 disappears. The count data from the counter 108 is applied through the data write and read line 34 to the memory 32, and to a $(2^{13}-1)$ detecting gate 116. The gate control of the AND gate 106 is performed by an output signal from the latch circuit 118 which receives at the set terminal "S" the sweep signal through the line 54. A differential circuit 120 is connected at the input terminal to the mode selection signal line 44, and receives the selection signal from the mode selection switch 44. The output terminal of the differential circuit 120 is connected to the reset terminal "R" of the counter 108. The output terminal of the differential circuit 120 is connected to one input terminal of an OR gate 122. The OR gate 122 is connected to the reset terminals "R" of the T flip-flop circuits 124 and 126. The T terminal of the T flip-flop 124 is connected to the output terminal of the detecting gate 116. The Q terminal of the T flip-flop 126 is connected to one input terminal of each of NOR gates 128 and 130. The $\overline{Q}$ terminal thereof is connected to one input terminals of NOR gates 132 and 134. The Q terminal of the flip-flop 124 is connected to the T terminal and the other input terminals of the NOR gates 128 and 132. The $\overline{Q}$ terminal of the flip-flop 124 is connected to the other input terminals of the NOR gates 130 and 134. The output terminal of the NOR gate 134 is connected to one input terminal of the OR gate 136 and the other input terminal of the OR gate 136 is connected to the sweeping stop signal line 40. The output terminal of the OR gate 136 is connected to the "reset" terminal "R" of the latch circuit 118. The output terminal of the NOR gate 134 is also connected to the other input terminal of the OR gate 122. The output terminals of the NOR gates 128, 130 and 132 are connected to the data bus line 34 and to the input terminal of the data selection circuit 138. The data selection circuit 138 is coupled with 3-bit data representing $V_L$, $V_H$ and UHF bands. The control of the data selection circuit 138 is performed by the mode selection signal from the line 44. The output terminal of the data selection circuit 138 is connected to a band change circuit of the tuner circuit.

Figure 4:
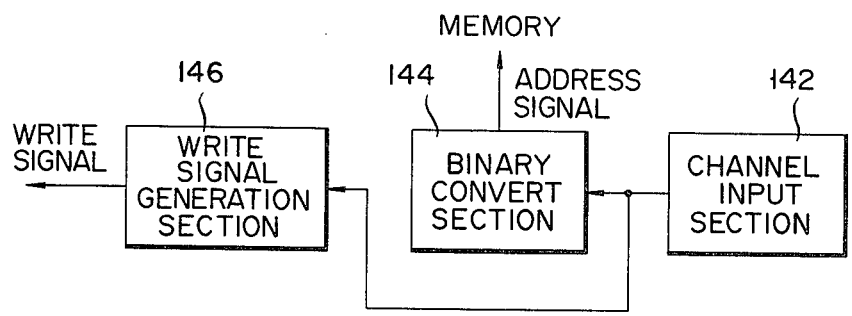
FIG. 4 is a block diagram of a position designation device used in the apparatus shown in FIG. 2.

FIG. 4 is a schematic diagram of the channel position designating device.

The channel position designating device is comprised of a channel input section 142, a binary convert section 144 for producing an address signal which is connected to the channel input section 142, and a write signal generation section 146 for producing a write signal which is connected to the channel input section.

Figure 5:
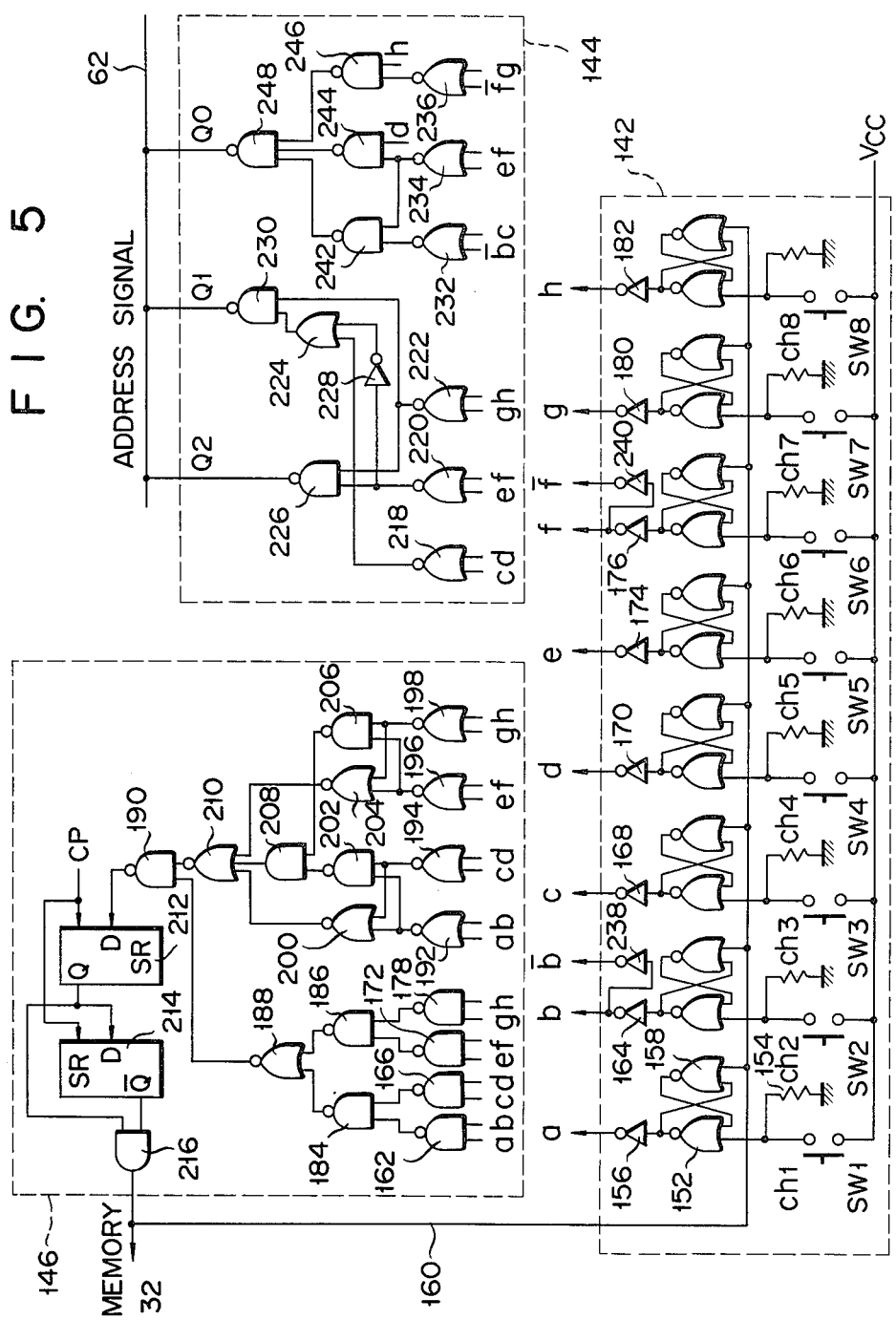
FIG. 5 is a circuit diagram of the position designating device shown in FIG. 4.

FIG. 5 is a detailed circuit diagram of the channel position designating device which is illustrated in the form of block diagram in FIG. 4. For simplicity of illustration, 8 channels are used in the circuit diagram of FIG. 5, although those are 12 channels in a practical device.

In an input section 142, switches SW1, SW2, ... SW8 are key switches for position designation. The switch SW1, for example, is coupled at one end with a power source voltage $V_{cc}$ and at the other end to one input terminal of a NOR gate 152. The connection point between the key switch SW1 and the NOR gate 152 is connected to a resistor 154 which is connected at one end to ground. The output terminal of the NOR gate 152 is connected to an inverter 156. The output terminal of the NOR gate 152 is connected to one input terminal of a NOR gate 158. The output terminal of the NOR gate 158 is connected to the other input terminal of the NOR gate 152. Thus, the NOR gate 152 and the NOR gate 158 are crossed in the connection. The input terminal of the NOR gate 158 is connected to a write signal line 160. The above-mentioned connecting arrangement may also be applied correspondingly to the remaining key buttons SW2 to SW8 and their NOR gates. The construction of the input section is as mentioned above.

The circuit illustration of FIG. 5 employs alphabets "a", "b", ... for illustrating interconnections between or among related parts, in place of lines, for simplicity of illustration. Accordingly, in sections blocked by dotted lines, the lines with the like alphabets are connected with each other. For example, the output terminal of the inverter 156 in the block 142 and one input terminal of a NAND gate 162 in the block 162 have each an alphabet "a" attached thereto and those are interconnected.

The construction of the write signal generating section 146 will be described. Two input terminals of the NAND gate 162 are connected to the output terminals of inverters 156 and 164, respectively. Two input terminals of NAND gates 166 are connected to the output terminals of inverters 168 and 170, respectively. Two input terminals of a NAND gate 172 are connected to the output terminals of inverters 174 and 176, respectively. Similarly, two input terminals of a NAND gate 178 are connected to the output terminals of inverters 180 and 182, respectively. The output terminals of NAND gates 162 and 166 are connected to two input terminals of a NAND gate 184, respectively. The output terminals of NAND gates 172 and 178 are connected to two input terminals of a NAND gate 186, respectively. The output terminals of the NAND gates 184 and 186 are connected to two input terminals of a NOR gate 188, respectively. The output terminal of the NOR gate 188 is connected to one input terminal of a NAND gate 190. Two input terminals of a NOR gate 192 respectively are connected to the output terminals of inverters 156 and 164, respectively. Similarly, the output terminals of inverters 168, 170, 174, and 176, 180 and 182, are connected to the input terminals of NOR gates 194, 196 and 198. The output terminal of the NOR gate 192 is connected to one input terminal of a NOR gate 200 and a NAND gate 202, respectively. The output terminal of the NOR gate 194 is connected to the other input terminals of the NOR gate 200 and a NAND gate 202, respectively. The output terminal of the NOR gate 196 is connected to one input terminal of a NOR gate 204 and a NAND gate 206. The output terminal of the NOR gate 198 is connected to the other input terminal of the NOR gate 204 and the NAND gate 206. The output terminals of the NAND gates 202 and 206 are respectively connected to two input terminals of the AND gate 208, respectively. The output terminals of the NOR gates 200 and 204 and the AND gate 208, respectively, are connected to three input terminals of the NOR gate 210. The output terminal of a NOR gate 210 is connected to the other input terminal of the NAND gate 190. The output terminal of the NAND gate 190 is connected to a data terminal "D" of a shift register 212. A clock pulse with a fixed period is applied to the shift register 212. The "Q" terminal of the shift register 212 is connected to the data terminal "D" of a shift register 214, and to one input terminal of an AND gate 216. The same clock pulse CP is also connected to the shift register 214. The "Q" terminal of the shift register 214 is applied to the other input terminal of the AND gate 216. The output terminal of the AND gate 216 is connected to the write signal line 65 connecting to the terminal $T_{WR}$ of the memory 32.

With respect to the binary converter section 144, the two input terminals of each of three NOR gates 218, 220 and 222 are connected to the output terminal of each of inverters 168, 170, inverters 174 and 176, and inverters 180 and 182, as shown. The output terminal of a NOR gate 218 is connected to one of the input terminals of the OR gate 224. The output terminal of the NOR gate 220 is connected to one input terminal of a NAND gate 226 and to the other input terminal of the NAND gate 224, through an inverter 228. The output terminal of the NOR gate 222 is connected to the other input terminal of the NAND gate 226 and to one input terminal of a NAND gate 230. The output terminal of the OR gate 224 is connected to the other input terminal of a NAND gate 230. The two input terminals of each of the NOR gates 232, 234 and 236 are connected to the output terminals of inverters 238 and 168, inverters 174 and 176, and inverters 240 and 180, as shown. The output terminal of a NOR gate 232 is connected to one input terminal of an AND gate 242. The output terminal of the NOR gate 234 is connected to the other input terminal of an AND gate 234 to one input terminal of an AND gate 244. The other input terminal of the AND gate 244 is connected to the output terminal of an inverter 170. The output terminal of a NOR gate 236 is connected to one input terminal of a NOR gate 246. The other input terminal of the NOR gate 246 is connected to the output terminal of an inverter 182. The output terminals of NAND gates 242, 244 and a NOR gate 246 are connected to three input terminals of a NAND gate 248. The output terminals of NAND gates 226, 230 and 248 are connected to an address line 62.

Figure 6:
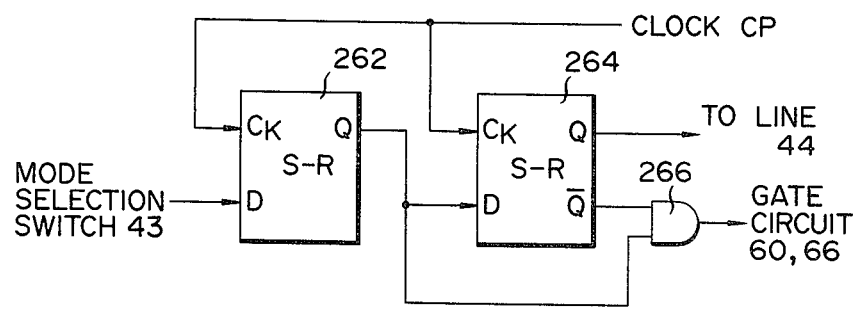
FIG. 6 is a schematic circuit diagram of a write signal generator used in the apparatus shown in FIG. 2.

FIG. 6 illustrates the construction of a write signal generator. Shift registers 262 and 264 receive at the Ck terminal a clock signal Cp. The shift register 262 is connected at the terminal D to the mode selection switch 43. The Q terminal of the shift register 262 is connected to the terminal D of the shift register 264 and to one input terminal of the AND gate 266. The Q terminal of the shift register 264 is connected to the other input terminal of the AND gate 266. The output terminal of the AND gate 266 is connected to the gate circuits 60 and 66.

As described above, the present invention provides the channel selection data memory device which is free from the failure of the data storage into the memory and the complicated data storing operation.

What is claimed is:

1. A channel selection data memory device comprising:
   a memory which allows pulse duty data for channel selection corresponding to channels to be read out from or written into said memory;
   position designating means for designating a given address for application to said memory and which generates a first write signal when it is operated;
   mode selection means for selecting a write mode in which the pulse duty data is written into said memory or a read mode in which the pulse duty data is read from said memory, said memory being responsive to said mode selection means;
   tuning pulse generating means which produces a pulse signal with a duty corresponding to the channel selection pulse duty data read out from said memory in the read mode, and writes in said memory channel selection pulse duty data with a pulse duty corresponding to the channel to be stored in the write mode;
   first write signal supply means for supplying to said memory said first write signal generated by said position designating means when it is operated;
   write signal generating means for producing a second write signal when said mode selection means is turned to a read mode; and
   second write signal supply means for supplying to said memory said second write signal from said write signal generating means.

2. A channel selection data memory device according to claim 1, wherein:
   said tuning pulse generating means writes said channel selection pulse duty data in memory in accordance with a sweep signal; and
   said device further comprises means for generating a sweep stop signal when a channel is being received, gate means through which said first write signal supplying means is connected to said memory, and means connected to said gate means which effects a gate control of said gate means comprising means for generating a logical product of a signal indicative of the presence of said sweep signal and said sweep stop signal.

3. A channel selection data memory device according to claim 1, wherein:

said tuning pulse generating means writes said channel selection pulse duty data in memory in accordance with a sweep signal; and said device further comprises means for generating a sweep stop signal when a channel is being received, gate means through which said second write signal supplying means is connected to said memory, and means connected to said gate means which effects a gate control of said gate means comprising means for generating a logical product of a signal indicative of the presence of said sweep signal and said sweep stop signal.

4. A channel selection data memory device according to claim 2 or 3, wherein said gate control means includes a first latch circuit which is set by said sweep signal, an AND gate having a first input terminal connected to the output terminal of said first latch circuit and a second input terminal responsive to said sweep stop signal, and a second latch circuit which is set by an output signal from said AND gate, an output terminal of said second latch circuit being connected to the control terminal of said gate means.

5. A channel selection data memory device according to claim 1, wherein said tuning pulse generating means writes said channel selection pulse duty data in memory in accordance with a sweep signal and said device further comprises:

first gate means through which said first write signal supply means is connected to said memory;

second gate means through which said second write signal supply means is connected to said memory;

means for generating a sweep stop signal when a channel is being received; and means connected to said first and second gate means which effects gate controls of said first and second gate means comprising means for generating a logical product of a signal indicative of the presence of said sweep signal and said sweep stop signal.

6. A channel selection data memory device according to claim 5, wherein said gate control means includes a first latch circuit set by said sweep signal, an AND gate having a first input terminal connected to the output terminal of said first latch circuit and a second input terminal responsive to said sweep stop signal, and a second latch circuit which is set by the output signal from said AND gate, an output terminal of said second latch circuit being connected to the control terminals of said first and second gate means.

* * * * *